United States Patent
Su

(10) Patent No.: US 10,985,151 B2
(45) Date of Patent: Apr. 20, 2021

(54) SEMICONDUCTOR PACKAGE AND METHOD FOR PREPARING THE SAME

(71) Applicant: NANYA TECHNOLOGY CORPORATION, New Taipei (TW)

(72) Inventor: Kuo-Hui Su, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 48 days.

(21) Appl. No.: 16/389,167

(22) Filed: Apr. 19, 2019

(65) Prior Publication Data
US 2020/0335486 A1    Oct. 22, 2020

(51) Int. Cl.
| H01L 25/18 | (2006.01) |
| H01L 23/31 | (2006.01) |
| H01L 23/48 | (2006.01) |
| H01L 21/56 | (2006.01) |
| H01L 23/00 | (2006.01) |
| H01L 23/522 | (2006.01) |
| H01L 21/768 | (2006.01) |

(52) U.S. Cl.
CPC ............ *H01L 25/18* (2013.01); *H01L 21/565* (2013.01); *H01L 21/76802* (2013.01); *H01L 21/76898* (2013.01); *H01L 23/3185* (2013.01); *H01L 23/481* (2013.01); *H01L 23/5226* (2013.01); *H01L 24/32* (2013.01)

(58) Field of Classification Search
CPC .................. H01L 23/3178; H01L 23/3142
See application file for complete search history.

(56) References Cited

U.S. PATENT DOCUMENTS

| 5,045,151 A * | 9/1991 | Edell ................... H01L 23/3157 |
| | | 257/622 |
| 2012/0248620 A1 * | 10/2012 | Kurita ............... H01L 23/49816 |
| | | 257/773 |
| 2019/0043833 A1 * | 2/2019 | Kwon ................. H01L 23/3185 |

FOREIGN PATENT DOCUMENTS

| TW | 200605298 A | 2/2006 |
| TW | M426143 U1 | 4/2012 |
| TW | 201535545 A | 9/2015 |

OTHER PUBLICATIONS

Office Action dated Mar. 27, 2020 related to Taiwanese Application No. 108126994.

* cited by examiner

*Primary Examiner* — Moazzam Hossain
*Assistant Examiner* — Mohammad A Rahman
(74) *Attorney, Agent, or Firm* — Muncy, Geissler, Olds & Lowe, P.C.

(57) ABSTRACT

The present disclosure relates to a semiconductor package and a method for preparing the same. The semiconductor package includes a lower semiconductor layer, an upper semiconductor layer, a fixturing structure, and a molding layer. The lower semiconductor layer includes an attached region and a fixturing region adjacent to the attached region. The upper semiconductor layer is disposed over the attached region. The fixturing structure is disposed adjacent to the upper semiconductor layer. The fixturing structure has at least one fixturing hole, the fixturing hole has an opening corresponding to the fixturing region, and the opening has a first width. The molding layer covers side walls of the upper semiconductor layer. The molding layer has at least one fixturing protrusion extending into the fixturing hole, the fixturing protrusion has a first expanding portion below the (Continued)

opening, and the first expanding portion has a second width greater than the first width.

14 Claims, 10 Drawing Sheets

# SEMICONDUCTOR PACKAGE AND METHOD FOR PREPARING THE SAME

TECHNICAL FIELD

The present disclosure relates to a semiconductor package and a method for preparing the same, and more particularly, to a semiconductor package and preparing the same, including a plurality of semiconductor layers and a molding layer.

DISCUSSION OF THE BACKGROUND

Semiconductor devices are essential for many modern applications. With the advancement of electronic technology, semiconductor devices are steadily becoming smaller and smaller while providing greater functionality and including greater amounts of integrated circuits. Due to the miniaturized scale of semiconductor devices, a conventional semiconductor package including a plurality of semiconductor layers is provided.

The conventional semiconductor package includes a lower semiconductor layer and an upper semiconductor layer disposed over an attached region of the lower semiconductor layer. A molding layer surrounding the upper semiconductor layer is disposed over a fixturing region of the lower semiconductor layer.

However, nowadays, the fixturing region is becoming smaller and smaller, and the molding layer may detach from the lower semiconductor layer.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor package. The semiconductor package includes a lower semiconductor layer, an upper semiconductor layer, a fixturing structure, and a molding layer. The lower semiconductor layer includes an attached region and a fixturing region adjacent to the attached region. The upper semiconductor layer is disposed over the attached region. The fixturing structure is disposed adjacent to the upper semiconductor layer. The fixturing structure has at least one fixturing hole, the fixturing hole has an opening corresponding to the fixturing region, and the opening has a first width. The molding layer covers side walls of the upper semiconductor layer. The molding layer has at least one fixturing protrusion extending into the fixturing hole, the fixturing protrusion has a first expanding portion below the opening, and the first expanding portion has a second width greater than the first width.

In some embodiments, the upper semiconductor layer is a chip stack including a plurality of semiconductor chips.

In some embodiments, the fixturing structure further includes an oxide layer over the fixturing region of the lower semiconductor layer, and the molding layer is disposed on the oxide layer.

In some embodiments, the at least one fixturing hole is located in the oxide layer.

In some embodiments, the at least one fixturing hole is located in the lower semiconductor layer.

In some embodiments, the fixturing protrusion extends from a top surface of the lower semiconductor layer into the fixturing hole.

In some embodiments, the semiconductor package further includes an adhesive layer disposed between the lower semiconductor layer and the upper semiconductor layer.

In some embodiments, the semiconductor package further includes through silicon vias (TSVs) electrically connecting contact pads below the lower semiconductor layer to the upper semiconductor layer.

In some embodiments, the fixturing structure is disposed around the upper semiconductor layer.

In some embodiments, the fixturing structure is a porosity structure, and the fixturing structure includes a plurality of the fixturing holes disposed around the upper semiconductor layer.

In some embodiments, the fixturing holes are blind holes.

Another aspect of the present disclosure provides a method for manufacturing a semiconductor package. The method comprises attaching an upper semiconductor layer over an attached region of a lower semiconductor layer; forming an oxide layer over a fixturing region of the lower semiconductor layer adjacent to the attached region; forming at least one fixturing hole in the oxide layer, wherein the fixturing hole includes an opening and a second expanding portion below the opening, the opening has a first width, and the second expanding portion has a second width greater than the first width of the opening; and forming a molding layer to cover side walls of the upper semiconductor layer and fill the at least one fixturing hole.

In some embodiments, the at least one fixturing hole is formed through wet etching the oxide layer.

In some embodiments, the method further comprising providing an etching mask over the oxide layer before forming the at least one fixturing hole in the oxide layer, wherein the etching mask has at least one etching via respectively corresponding to the at least one opening of the fixturing hole; and removing the etching mask after forming the at least one fixturing hole.

In some embodiments, the method further comprises curing the molding layer.

In some embodiments, the method further includes forming an adhesive layer between the upper semiconductor layer and the lower semiconductor layer.

Another aspect of the present disclosure provides a method for manufacturing a semiconductor package. The method comprises attaching an upper semiconductor layer over an attached region of a lower semiconductor layer; forming at least one fixturing hole in a fixturing region of the lower semiconductor layer, wherein the fixturing hole includes an opening and a second expanding portion below the opening, the opening has a first width, and the second expanding portion has a second width greater than the first width of the opening; and forming a molding layer to cover side walls of the upper semiconductor layer and fill the at least one fixturing hole.

In some embodiments, the at least one fixturing hole is formed through wet etching the lower semiconductor layer.

In some embodiments, the method further comprises providing an etching mask over the fixturing region of the lower semiconductor layer before forming the at least one fixturing hole in the fixturing region of the lower semiconductor layer, wherein the etching mask has at least one etching via respectively corresponding to the at least one opening of the fixturing hole; and removing the etching mask after forming the at least one fixturing hole.

In some embodiments, the method further comprises curing the molding layer.

In some embodiments, further comprises forming an adhesive layer between the upper semiconductor layer and the lower semiconductor layer.

With the design of the semiconductor package of the present disclosure, the semiconductor package includes a fixturing structure and the fixturing protrusions to strengthen the adhesive strength between the molding layer and the lower semiconductor layer.

In addition, the width of the fixturing protrusion of the molding layer is greater than the width of the opening of the fixturing hole, so that the molding layer can be adhered and fastened to the fixturing hole of the lower semiconductor layer more stably.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims. The disclosure should also be understood to be coupled to the figures' reference numbers, which refer to similar elements throughout the description.

DETAILED DESCRIPTION

Figure 1:
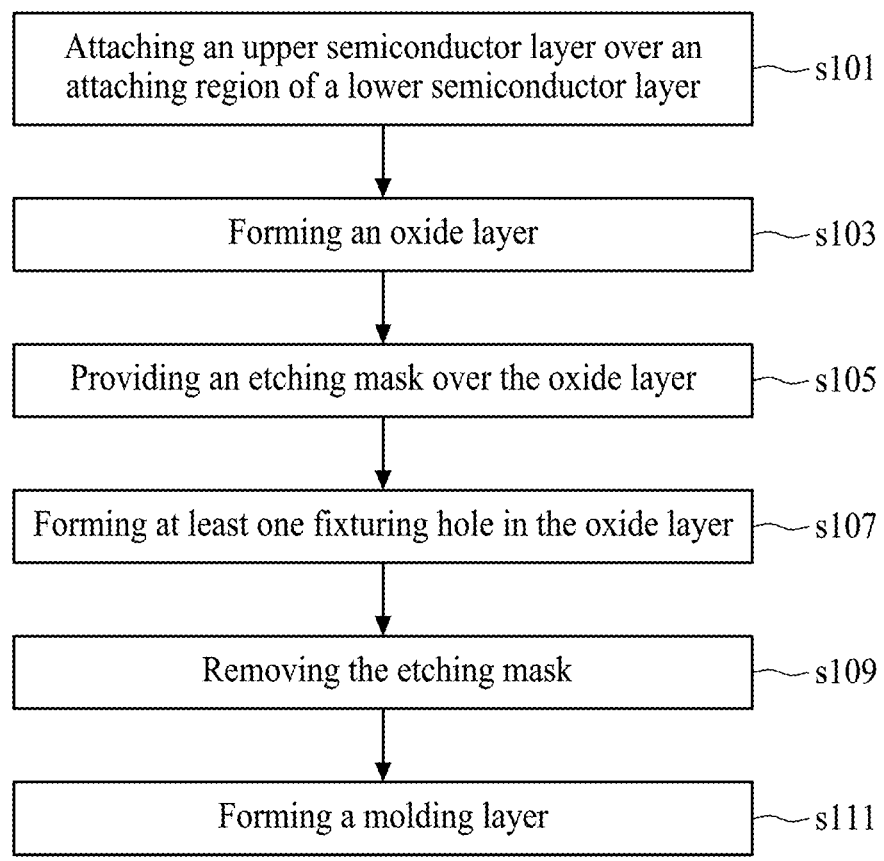
FIG. 1 is a flow diagram illustrating a method for manufacturing a semiconductor package in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

References to "one embodiment," "some embodiments," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprise" and "comprising," when used in this specification, point out the presence of stated features, integers, steps, operations, elements, or components, but do not preclude the presence or addition of one or more other features, integers, steps, operations, elements, components, or groups thereof.

Figure 2:
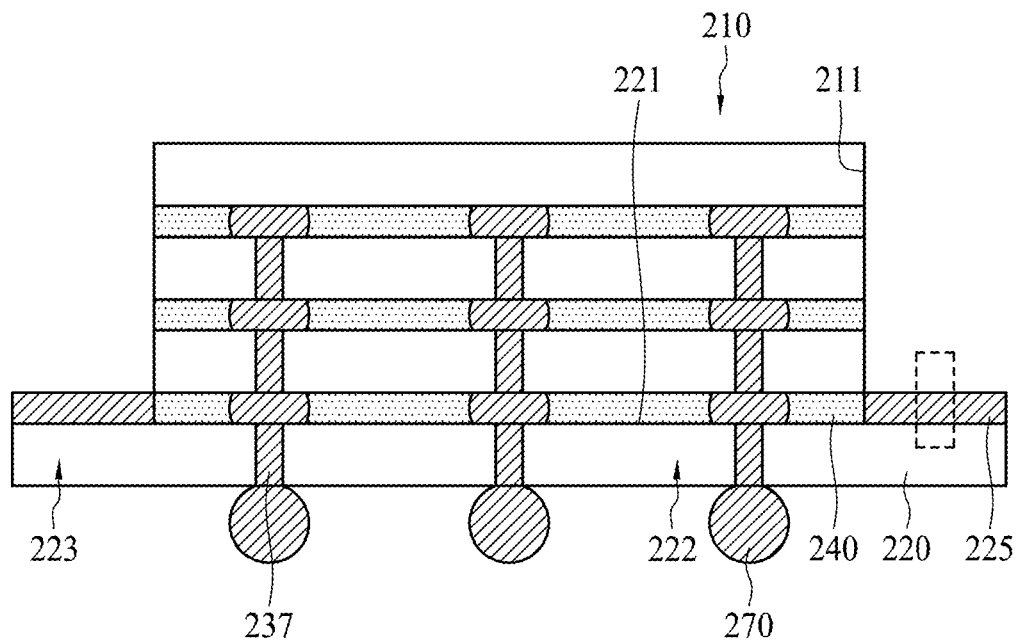
FIG. 2 is a schematic view illustrating stages of manufacturing a semiconductor package by the method of FIG. 1 in accordance with some embodiments of the present disclosure.
Figure 3:
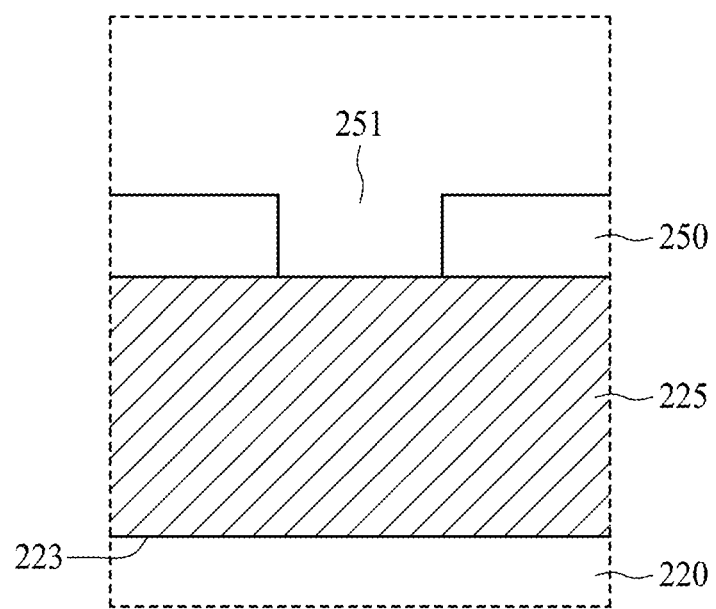
FIGS. 3 to 5 are schematic views of partial enlargement illustrating stages of manufacturing a semiconductor package by the method of FIG. 1 in accordance with some embodiments of the present disclosure.
Figure 4:
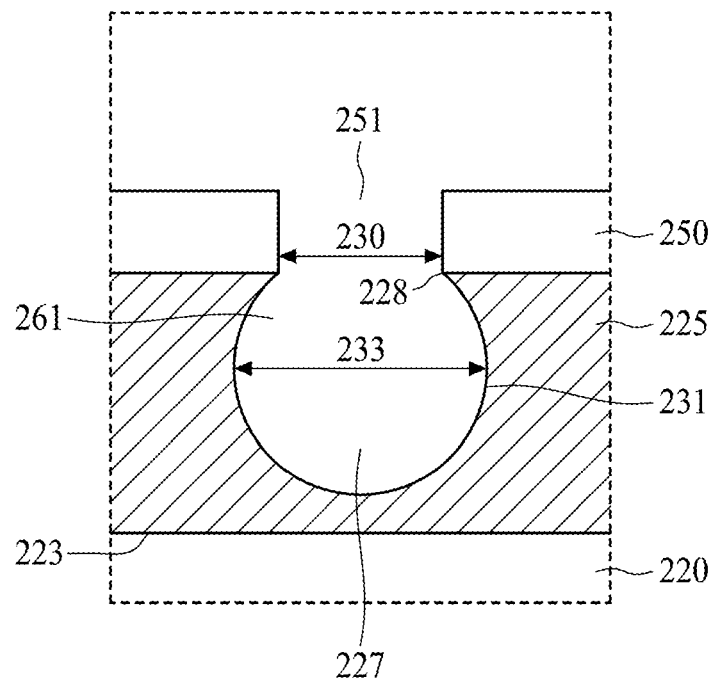
Figure 5:
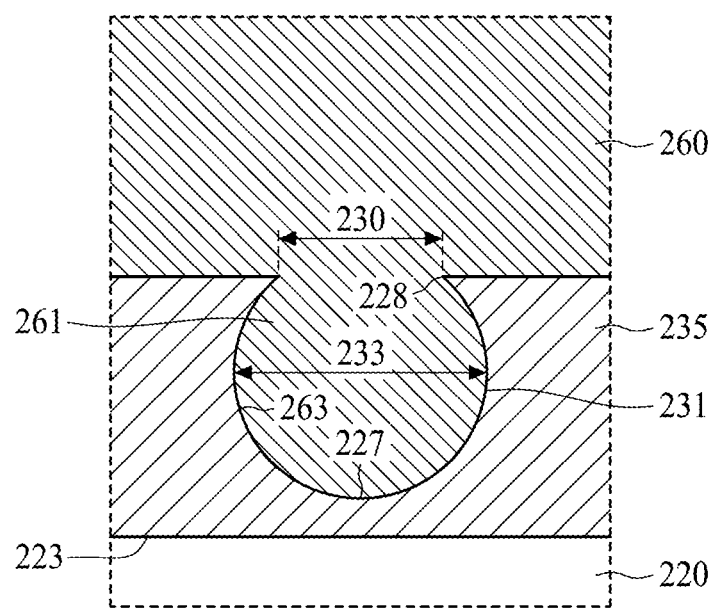
Figure 6:
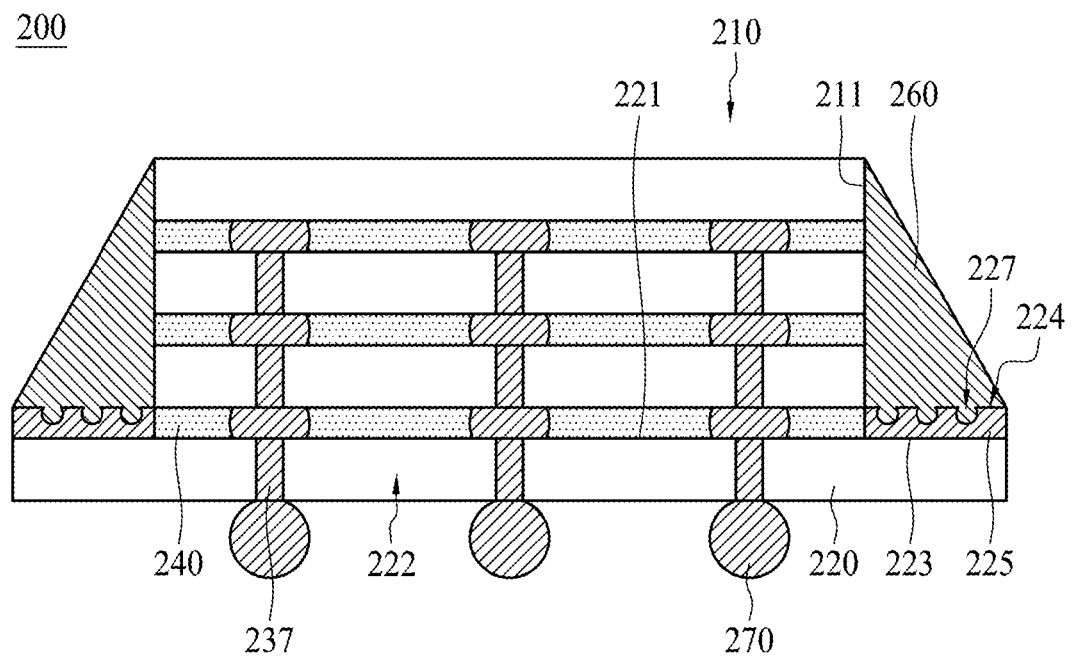
FIG. 6 is a schematic view of a semiconductor package in accordance with some embodiments of the present disclosure.
Figure 7:
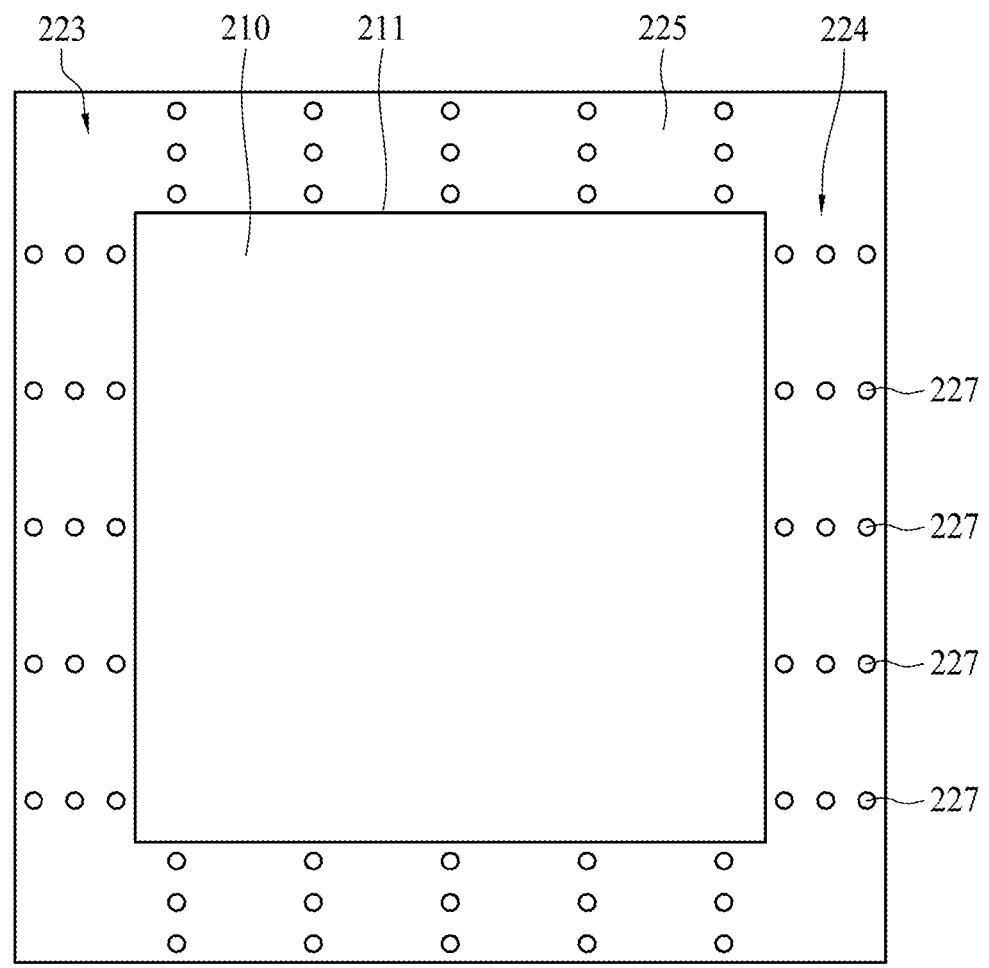
FIG. 7 is a plane view of a semiconductor package in accordance with some embodiments of the present disclosure.

FIG. 1 is a flow diagram illustrating a method 100 for manufacturing a semiconductor package in accordance with some embodiments of the present disclosure. FIG. 2 is a schematic view illustrating stages of manufacturing a semiconductor package by the method 100 of FIG. 1 in accordance with some embodiments of the present disclosure. FIGS. 3 to 5 are schematic views of partial enlargement illustrating stages of manufacturing a semiconductor package by the method 100 of FIG. 1 in accordance with some embodiments of the present disclosure. FIG. 6 is a schematic view of a semiconductor package 200 in accordance with some embodiments of the present disclosure. FIG. 7 is a plane view of a semiconductor package in accordance with some embodiments of the present disclosure. In some embodiments, the method 100 of FIG. 1 for manufacturing the semiconductor package 200 includes a number of operations (s101, s103, s105, s107, s109, and s111), and the description and illustration below are not deemed as a limitation as the sequence of the operations.

In operation s101, as shown in FIG. 2, an upper semiconductor layer 210 is attached over an attached region 222 of a lower semiconductor layer 220. In some embodiments, an adhesive layer 240 is formed between the upper semiconductor layer 210 and the lower semiconductor layer 220 to adhere the upper semiconductor layer 210 to the lower semiconductor layer 220. In some embodiments, the upper semiconductor layer 210 is a chip stack including a plurality semiconductor chips, for example, memory chips (DRAM, etc.). In some embodiments, the lower semiconductor layer 220 may be a controller chip.

In operation s103, as shown in FIG. 2, an oxide layer 225 is formed over a fixturing region 223 of the lower semiconductor layer 220. The fixturing region 223 is adjacent to the attached region 222. In some embodiments, the oxide layer 225 includes silicon oxide material.

In operation s105, as shown in FIG. 3, an etching mask 250 is provided over the oxide layer 225. In some embodiments, the etching mask 250 has at least one etching via 251. In some embodiments, the etching mask 250 has a plurality of etching vias 251.

In operation s107, as shown in FIG. 4, at least one fixturing hole 227 is formed in the oxide layer 225. In some embodiments, a plurality of the fixturing holes 227 are formed.

In some embodiments, the fixturing holes 227 are formed through an isotropic etching process. In some embodiments, the oxide layer 225 is wet etched through the etching vias 251. In this way, an undercut effect occurs under the etching mask 250. Each of the fixturing holes 227 includes an opening 228 and a second expanding portion 231 below the opening 228. In some embodiments, the openings 228 respectively correspond to the etching vias 251. The opening 228 has a first width 230, and the second expanding portion 231 has a second width 233. The second width 233 of the second expanding portion 231 is greater than the first width 230 of the opening 228.

In operation s109, as shown in FIG. 5, the etching mask is removed. In some embodiments, the etching mask may be removed through another etching process or a chemical mechanical planarization (CMP) process.

In operation s111, as shown in FIG. 5, a molding layer 260 is formed. The molding layer 260 fills the fixturing holes 227. In this way, fixturing protrusions 261 of the molding layer 260 are formed and extend into the fixturing holes 227. Each of the fixturing protrusions 261 has a first expanding portion 263 respectively corresponding to the second expanding portion 231, and the first expanding portion 263 has the second width 233. That is, the first expanding portion 263 and the second expanding portion 231 have the same width.

As shown in FIG. 6, the molding layer 260 covers side walls 211 of the upper semiconductor layer 210. In some embodiments, the molding layer 260 is cured through a thermal curing process. In some embodiments, the molding layer 260 includes epoxy compound material.

With the above operations, the semiconductor package 200 is provided as shown in FIG. 6. The lower semiconductor layer 220 includes the attached region 222 and the fixturing region 223 adjacent to the attached region 222. The upper semiconductor layer 210 is disposed over the attached region 222. The upper semiconductor layer 210 is a chip stack including a plurality of semiconductor chips. The adhesive layer 240 is disposed between the lower semiconductor layer 220 and the upper semiconductor layer 210. A plurality of through silicon vias (TSVs) 237 are formed in the lower semiconductor layer 220 to electrically connect contact pads 270 below the lower semiconductor layer 220 to the upper semiconductor layer 210. A fixturing structure 224 is disposed adjacent to the upper semiconductor layer 210. The fixturing structure 224 has the at least one fixturing hole 227. The molding layer 260 covers side walls 211 of the upper semiconductor layer 210.

As shown in FIG. 7, the fixturing structure 224 is disposed around the upper semiconductor layer 210. The fixturing structure 224 is a porosity structure, and the fixturing structure 224 includes the plurality of the fixturing holes 227 disposed around the upper semiconductor layer 210

As shown in FIG. 5, each of the fixturing holes 227 has the opening 228 corresponding to the fixturing region 223 (FIG. 6). The opening 228 has the first width 230. The fixturing structure further includes an oxide layer 225 over the fixturing region 223 of the lower semiconductor layer 220. The molding layer 260 is disposed on the oxide layer 225. The at least one fixturing hole 227 is located in the oxide layer 225. The fixturing holes 227 are blind holes. The molding layer 260 has the at least one fixturing protrusion 261 extending into the fixturing hole 227. The fixturing protrusions 261 have the first expanding portions 263 below the openings 228, and each of the first expanding portions 263 has the second width 233 greater than the first width 230.

Figure 8:
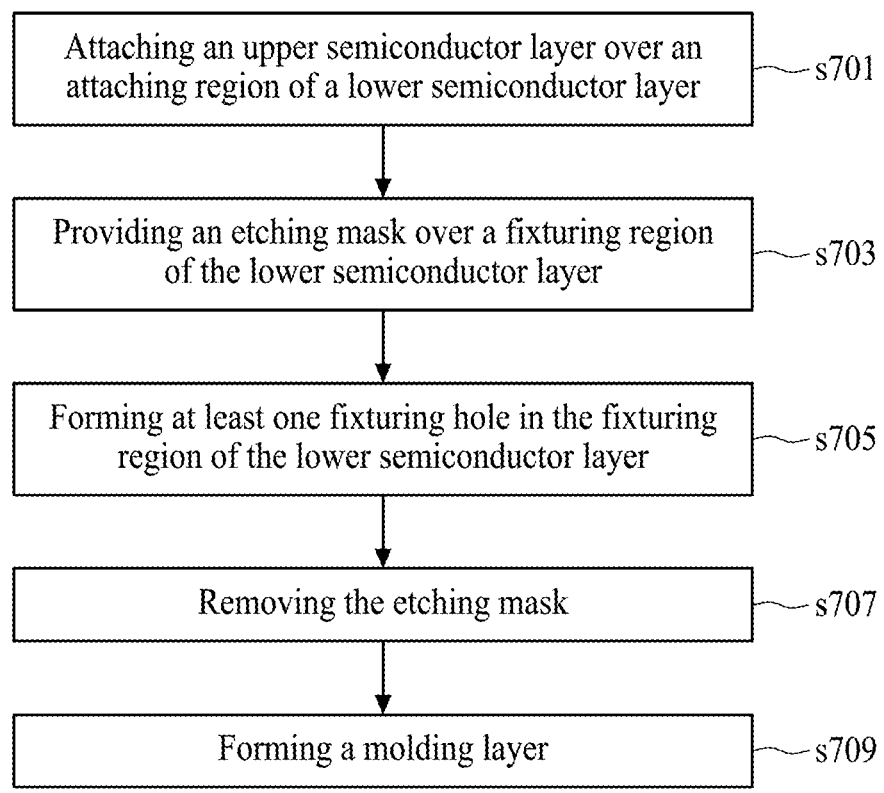
FIG. 8 is a flow diagram illustrating a method for manufacturing a semiconductor package in accordance with some embodiments of the present disclosure.
Figure 9:
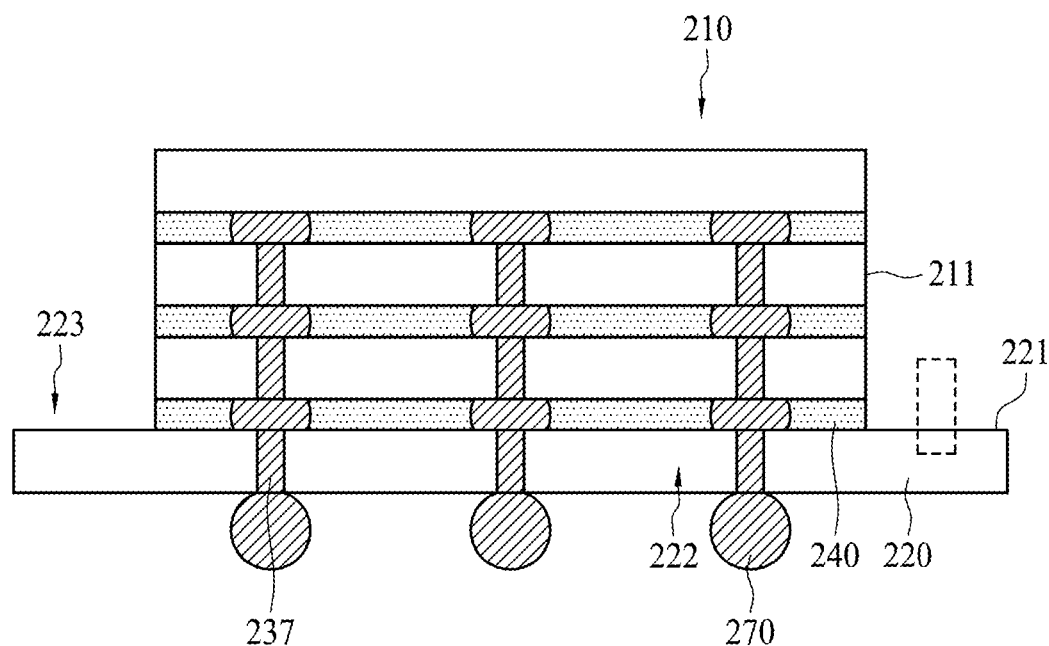
FIG. 9 is a schematic view illustrating stages of manufacturing a semiconductor package by the method of FIG. 8 in accordance with some embodiments of the present disclosure.
Figure 10:
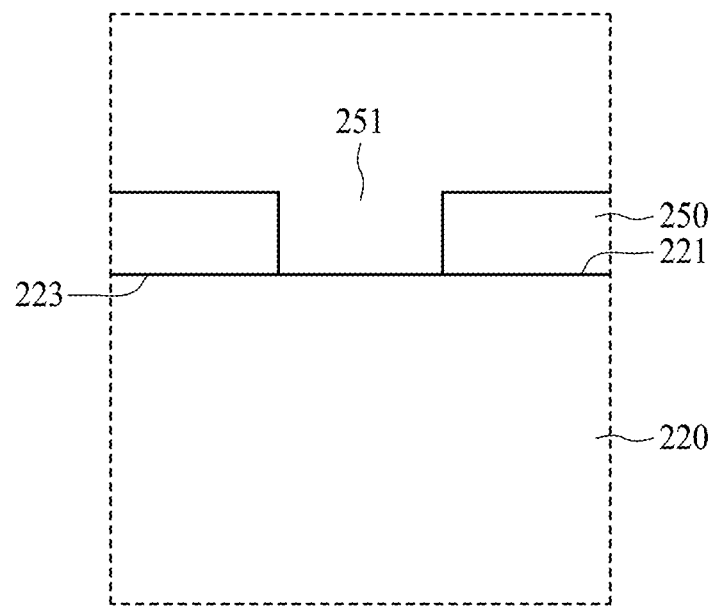
FIGS. 10 to 12 are schematic views of partial enlargement illustrating stages of manufacturing a semiconductor package by the method of FIG. 8 in accordance with some embodiments of the present disclosure.
Figure 11:
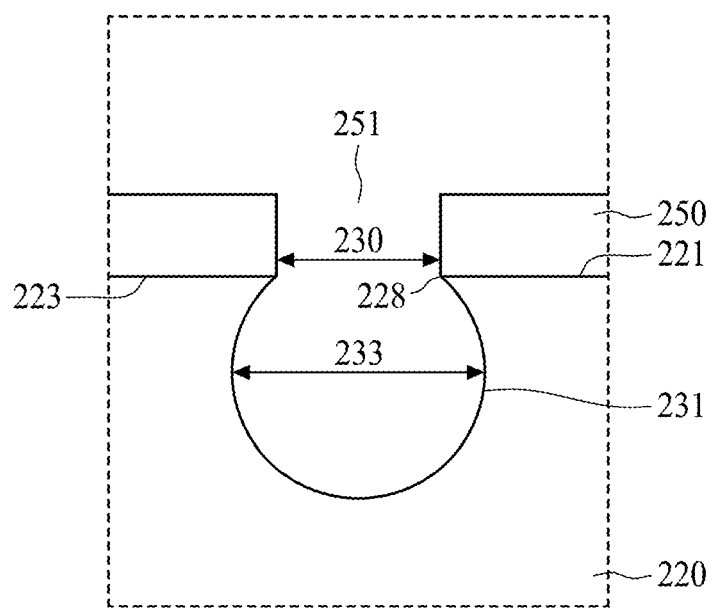
Figure 12:
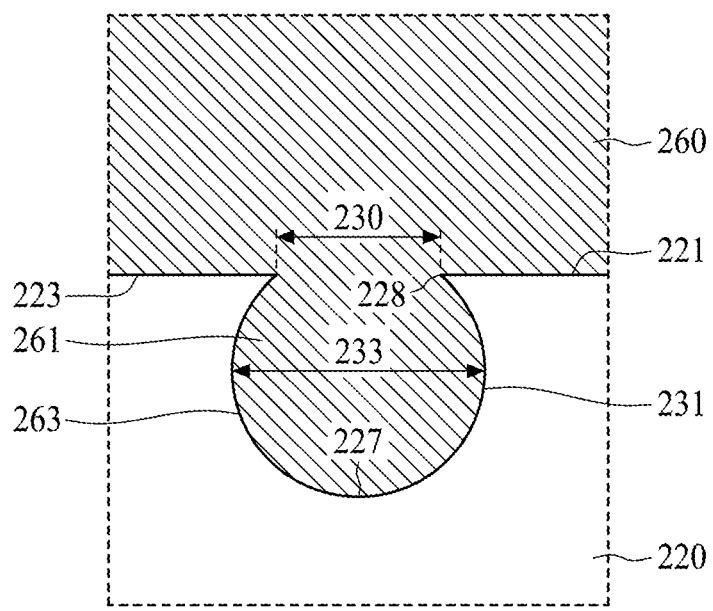
Figure 13:
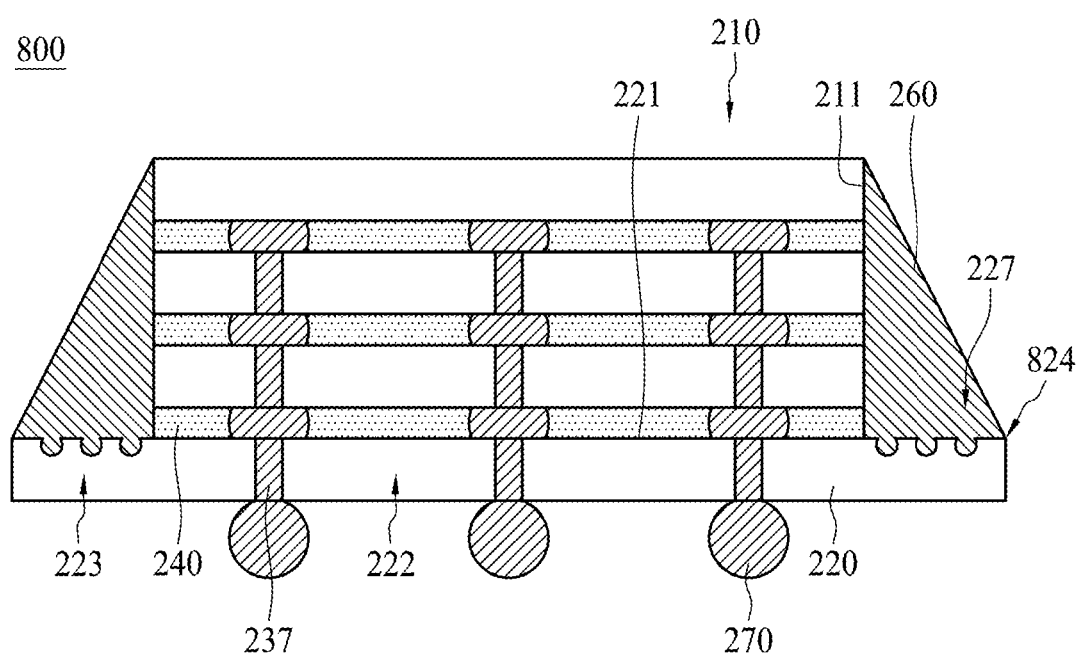
FIG. 13 is a schematic view of a semiconductor package in accordance with some embodiments of the present disclosure.
Figure 14:
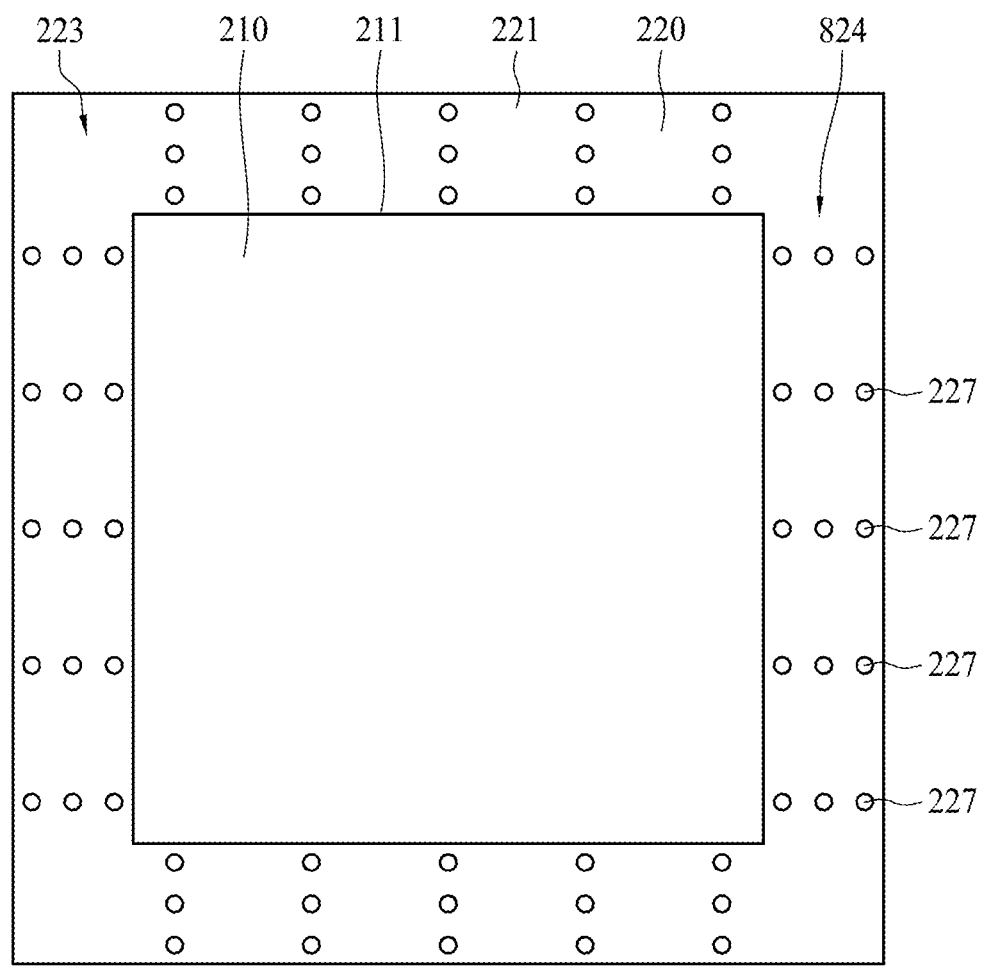
FIG. 14 is a plane view of a semiconductor package in accordance with some embodiments of the present disclosure.

FIG. 8 is a flow diagram illustrating a method 700 for manufacturing a semiconductor package in accordance with some embodiments of the present disclosure. FIG. 9 is a schematic view illustrating stages of manufacturing a semiconductor package by the method 700 of FIG. 8 in accordance with some embodiments of the present disclosure. FIGS. 10 to 12 are schematic views of partial enlargement illustrating stages of manufacturing a semiconductor package by the method 700 of FIG. 8 in accordance with some embodiments of the present disclosure. FIG. 13 is a schematic view of a semiconductor package 800 in accordance with some embodiments of the present disclosure. FIG. 14 is a plane view of a semiconductor package in accordance with some embodiments of the present disclosure. In some embodiments, the method 700 of FIG. 8 for manufacturing the semiconductor package 800 includes a number of operations (s701, s703, s705, s707, and s709), and the description and illustration below are not deemed as a limitation as the sequence of the operations.

In operation s701, as shown in FIG. 9, an upper semiconductor layer 210 is attached over an attached region 222 of a lower semiconductor layer 220. In some embodiments, an adhesive layer 240 is formed between the upper semiconductor layer 210 and the lower semiconductor layer 220 to adhere the upper semiconductor layer 210 to the lower semiconductor layer 220.

In some embodiments, the upper semiconductor layer 210 is a chip stack including a plurality semiconductor chips, for example, memory chips (DRAM, etc.). In some embodiments, the lower semiconductor layer 220 may be a controller chip.

In operation s703, as shown in FIG. 10, an etching mask 250 is provided over an fixturing region 223 of the lower semiconductor layer 220. In some embodiments, the fixturing region 223 is adjacent to the attached region 222. The etching mask 250 has at least one etching via 251. In some embodiments, the etching mask 250 has a plurality of etching vias 251.

After providing the etching mask 250, in operation s705, as shown in FIG. 11, at least one fixturing hole 227 is formed in the fixturing region 223 of the lower semiconductor layer 220. In some embodiments, a plurality of the fixturing holes 227 are formed.

In some embodiments, the fixturing holes 227 are formed through an isotropic etching process. In some embodiments, the lower semiconductor layer 220 is wet etched through the etching vias 251. In this way, an undercut effect occurs under the etching mask 250. Each of the fixturing holes 227 includes an opening 228 and a second expanding portion 231 below the opening 228.

In some embodiments, the openings 228 respectively correspond to the etching vias 251. Each of the openings 228 has a first width 230, and the second expanding portion 231 has a second width 233. The second width 233 of the second expanding portion 231 is greater than the first width 230 of the opening 228.

In operation s707, as shown in FIG. 12, the etching mask is removed after forming the fixturing holes 227. In some embodiments, the etching mask may be removed through another etching process or a chemical mechanical planarization (CMP) process.

In operation s709, as shown in FIG. 12, a molding layer 260 is formed. The molding layer 260 fills the fixturing holes 227. In this way, fixturing protrusions 261 of the molding layer 260 are formed and extend into the fixturing holes 227. Each of the fixturing protrusions 261 has a first expanding portion 263 respectively corresponding to the second expanding portion 231, and the first expanding portion 263 of the fixturing protrusion 261 has the second width 233. In some embodiments, the first expanding portion 263 of the fixturing protrusion 261 and the second expanding portion 231 of the fixturing hole 227 have the same width.

As shown in FIG. 13, the molding layer 260 covers side walls 211 of the upper semiconductor layer 210. In some embodiments, the molding layer 260 is cured through a thermal curing process. In some embodiments, the molding layer 260 includes epoxy compound material.

With the above operations, the semiconductor package 800 is provided as shown in FIG. 13. The lower semiconductor layer 220 includes the attached region 222 and the fixturing region 223 adjacent to the attached region 222. The upper semiconductor layer 210 is disposed over the attached region 222 of the lower semiconductor layer 220. The upper semiconductor layer 210 is a chip stack including a plurality of semiconductor chips. The adhesive layer 240 is disposed between the lower semiconductor layer 220 and the upper semiconductor layer 210. A plurality of through silicon vias (TSVs) 237 are formed in the lower semiconductor layer 220 to electrically connect contact pads 270 below the lower semiconductor layer 220 to the upper semiconductor layer 210. A fixturing structure 824 is disposed adjacent to the upper semiconductor layer 210. The fixturing structure 824 has the at least one fixturing hole 227. The molding layer 260 covers side walls 211 of the upper semiconductor layer 210.

As shown in FIG. 14, the fixturing structure 824 is disposed around the upper semiconductor layer 210. The fixturing structure 824 is a porosity structure, and the fixturing structure 824 includes the plurality of the fixturing holes 227 disposed around the upper semiconductor layer 210.

As shown in FIG. 12, each of the fixturing holes 227 has the opening 228 corresponding to the fixturing region. The opening 228 has the first width 230. The at least one fixturing hole 227 is located in the lower semiconductor layer 220. The fixturing holes 227 are blind holes. The molding layer 260 has the at least one fixturing protrusion 261 extending into the fixturing hole 227. The fixturing protrusion 261 extends from a top surface 221 of the lower semiconductor layer 220 into the fixturing hole 227. The fixturing protrusions 261 have the first expanding portions 263 below the openings 228, and each of the first expanding portions 263 has the second width 233 greater than the first width 230.

In conclusion, with the configuration of the semiconductor package of the present disclosure, the semiconductor package includes a fixturing structure and the fixturing protrusions to strengthen the adhesive strength between the molding layer and the lower semiconductor layer.

In addition, the width of the fixturing protrusion of the molding layer is greater than the width of the opening of the fixturing hole, so that the molding layer can be adhered and fastened to the fixturing hole of the lower semiconductor layer more stably.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

One aspect of the present disclosure provides a semiconductor package. The semiconductor package comprises a lower semiconductor layer, an upper semiconductor layer, a fixturing structure, and a molding layer. The lower semiconductor layer includes an attached region and a fixturing region adjacent to the attached region. The upper semiconductor layer is disposed over the attached region. The fixturing structure is disposed adjacent to the upper semiconductor layer. The fixturing structure has at least one fixturing hole, the fixturing hole has an opening corresponding to the fixturing region, and the opening has a first width. The molding layer covers side walls of the upper semiconductor layer. The molding layer has at least one fixturing protrusion extending into the fixturing hole, the fixturing protrusion has a first expanding portion below the opening, and the first expanding portion has a second width greater than the first width.

Another aspect of the present disclosure provides a method for manufacturing a semiconductor package. The method comprises attaching an upper semiconductor layer over an attached region of a lower semiconductor layer; forming an oxide layer over a fixturing region of the lower semiconductor layer adjacent to the attached region; forming at least one fixturing hole in the oxide layer, wherein the fixturing hole includes an opening and a second expanding portion below the opening, the opening has a first width, and the second expanding portion has a second width greater than the first width of the opening; and forming a molding layer to cover side walls of the upper semiconductor layer and fill the at least one fixturing hole.

Another aspect of the present disclosure provides a method for manufacturing a semiconductor package. The method comprises attaching an upper semiconductor layer over an attached region of a lower semiconductor layer; forming at least one fixturing hole in a fixturing region of the lower semiconductor layer, wherein the fixturing hole includes an opening and a second expanding portion below the opening, the opening has a first width, and the second expanding portion has a second width greater than the first width of the opening; and forming a molding layer to cover side walls of the upper semiconductor layer and fill the at least one fixturing hole.

The scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor package, comprising:
    a lower semiconductor layer including an attached region and a fixturing region adjacent to the attached region, wherein the lower semiconductor layer includes a chip;
    an upper semiconductor layer disposed over the attached region;
    a fixturing structure disposed adjacent to the upper semiconductor layer and over the fixturing region of the lower semiconductor layer, wherein the fixturing structure has an oxide layer over the fixturing region and at least one fixturing hole formed in the oxide layer, the fixturing hole has an opening corresponding to the fixturing region, and the opening has a first width; and
    a molding layer covering side walls of the upper semiconductor layer and disposed on the oxide layer of the fixturing structure, wherein the molding layer has at least one fixturing protrusion extending into the fixturing hole formed in the oxide layer, the fixturing protrusion has a first expanding portion below the opening, and the first expanding portion has a second width greater than the first width.

2. The semiconductor package of claim 1, wherein the upper semiconductor layer is a chip stack including a plurality of semiconductor chips.

3. The semiconductor package of claim 1, wherein the at least one fixturing hole is located in the oxide layer.

4. The semiconductor package of claim 1, wherein the fixturing protrusion extends from a top surface of the lower semiconductor layer into the fixturing hole.

5. The semiconductor package of claim 1, further including an adhesive layer disposed between the lower semiconductor layer and the upper semiconductor layer.

6. The semiconductor package of claim 1, further including through silicon vias electrically connecting contact pads below the lower semiconductor layer to the upper semiconductor layer.

7. The semiconductor package of claim 1, wherein the fixturing structure is disposed around the upper semiconductor layer.

8. The semiconductor package of claim 7, wherein the fixturing structure includes a plurality of the fixturing holes disposed around the upper semiconductor layer.

9. The semiconductor package of claim 8, wherein the fixturing holes are blind holes.

10. A method for manufacturing a semiconductor package, comprising:
    attaching an upper semiconductor layer over an attached region of a lower semiconductor layer, wherein the lower semiconductor layer includes a chip;
    forming an oxide layer over a fixturing region of the lower semiconductor layer adjacent to the attached region;
    forming at least one fixturing hole in the oxide layer, wherein the fixturing hole includes an opening and a second expanding portion below the opening, the opening has a first width, and the second expanding portion has a second width greater than the first width of the opening; and
    forming a molding layer to cover side walls of the upper semiconductor layer and to be disposed on the oxide layer and to fill the at least one fixturing hole formed in the oxide layer.

11. The method of claim 10, wherein the at least one fixturing hole is formed through wet etching the oxide layer.

12. The method of claim 10, further comprising:
    providing an etching mask over the oxide layer before forming the at least one fixturing hole in the oxide layer, wherein the etching mask has at least one etching via respectively corresponding to the at least one opening of the fixturing hole; and
    removing the etching mask after forming the at least one fixturing hole.

13. The method of claim 10, further comprising:
    curing the molding layer.

14. The method of claim 10, further comprising:
    forming an adhesive layer between the upper semiconductor layer and the lower semiconductor layer.

* * * * *